United States Patent
Hamochi

(10) Patent No.: US 8,987,682 B2
(45) Date of Patent: Mar. 24, 2015

(54) SPECIMEN POSITIONING DEVICE, CHARGED PARTICLE BEAM SYSTEM, AND SPECIMEN HOLDER

(71) Applicant: JEOL Ltd., Tokyo (JP)

(72) Inventor: Mitsuru Hamochi, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/101,460

(22) Filed: Dec. 10, 2013

(65) Prior Publication Data
US 2014/0158907 A1 Jun. 12, 2014

(30) Foreign Application Priority Data
Dec. 10, 2012 (JP) .................. 2012-269200

(51) Int. Cl.
- *H01J 37/20* (2006.01)
- *G21K 5/08* (2006.01)
- *G21K 5/10* (2006.01)
- *H01J 37/26* (2006.01)

(52) U.S. Cl.
CPC *H01J 37/20* (2013.01); *H01J 37/26* (2013.01)
USPC ............... 250/442.11; 250/440.11; 250/311; 250/310; 250/306; 73/864.91

(58) Field of Classification Search
CPC ... H01J 37/20; H01J 37/26; H01J 2237/0458; H01J 2237/202; H01J 2237/20214; H01L 21/68742; H01L 21/6875
USPC ............... 250/442.11, 440.11, 311, 310, 306; 73/864.91
See application file for complete search history.

(56) References Cited

U.S. PATENT DOCUMENTS

| 4,587,431 | A | * | 5/1986 | Uemura | 250/442.11 |
| 7,772,567 | B2 | * | 8/2010 | Kato | 250/442.11 |
| 8,008,633 | B2 | * | 8/2011 | Fujiyoshi et al. | 250/440.11 |
| 8,101,924 | B2 | * | 1/2012 | Hamochi | 250/442.11 |

FOREIGN PATENT DOCUMENTS

| JP | 2010113810 A | 5/2010 |
| JP | 2010157491 A | 7/2010 |

* cited by examiner

*Primary Examiner* — Nikita Wells
(74) *Attorney, Agent, or Firm* — The Webb Law Firm

(57) ABSTRACT

A specimen positioning device (100) is for use in or with a charged particle beam system having a specimen chamber (1) and has: a base (10) provided with a hole (12) in operative communication with the specimen chamber (1); a specimen holder (20) movably mounted in the hole (12) and having a first portion (22) and a second portion (24); and a first portion support portion (40) supporting the first portion (22) in the specimen chamber (1). The second portion (24) supports the first portion (22) via a resilient member (34).

12 Claims, 8 Drawing Sheets

FIG. 4
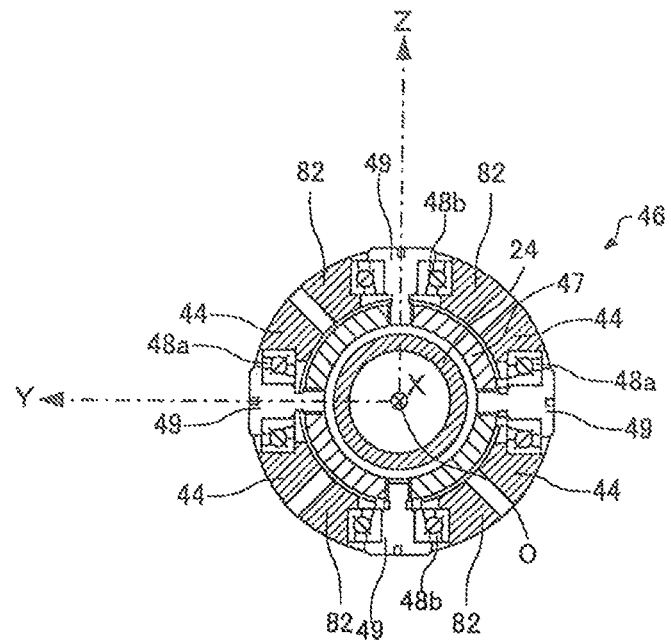
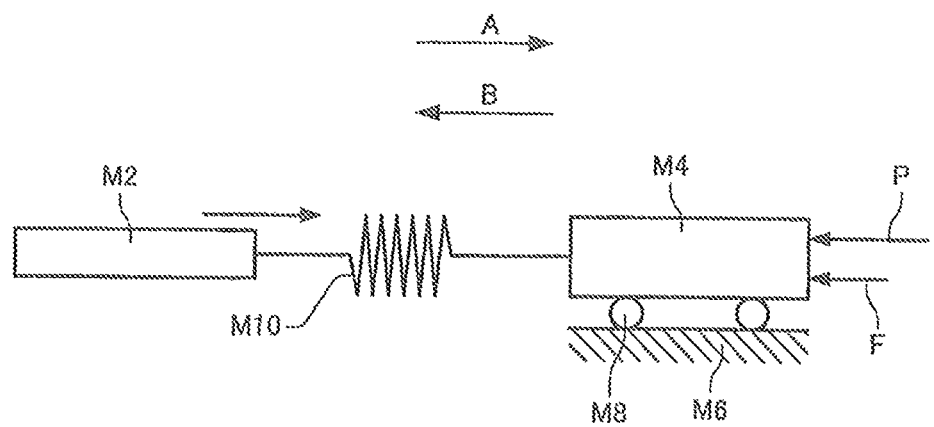
FIG. 5

SPECIMEN POSITIONING DEVICE, CHARGED PARTICLE BEAM SYSTEM, AND SPECIMEN HOLDER

BACKGROUND OF THE INVENTION

1. Field of the Invention

The present invention relates to a specimen positioning device, charged particle beam system, and specimen holder.

2. Description of Related Art

In electron microscopy, in a case where a specimen is observed at high (such as atomic scale) magnification or where a specimen is analyzed at high accuracy, external disturbing vibrations present problems. Such external disturbing vibrations are produced, for example, by vibrations of a floor on which the instrument is mounted. In electron microscopy, the instrumentation is vibrated by external disturbing vibrations. As a result, problems such as vibrations of electron microscope images are caused (see, for example, JP-A-2010-113810).

In an electron microscope, the specimen is placed in position by a specimen positioning device. For example, JP-A-2010-157491 discloses a specimen positioning device comprising a specimen holder for supporting a specimen, an X-axis drive mechanism for translating the specimen in the X-direction, and a Y-axis drive mechanism for translating the specimen in the Y-direction.

The X-axis drive mechanism set forth in JP-A-2010-157491 has a lever that supports the position of a specimen along the X-axis while preventing the specimen holder from being drawn in by atmospheric pressure. The specimen is moved in the X-direction by rotating the lever. That is, the X-axis drive mechanism places the specimen in position in the X-direction by placing the specimen holder in position.

The Y-drive mechanism set forth in JP-A-2010-157491 has a shifter provided with a through-hole in which the specimen holder is accommodated. The specimen is moved in the Y-direction by rotating the shifter about the center of a spherical bearing. That is, with this Y-axis drive mechanism, the specimen is placed in position in the Y-direction by placing the specimen holder, shifter, and spherical bearing in position.

SUMMARY OF THE INVENTION

One object associated with some aspects of the present invention is to provide a specimen positioning device, charged particle beam system, and specimen holder capable of reducing the effects of external disturbing vibrations.

(1) A specimen positioning device associated with the present invention is for use in or with a charged particle beam system including a specimen chamber and has: a base provided with a hole in operative communication with the specimen chamber in the charged particle beam system; a specimen holder including a first portion and a second portion and movably mounted in the hole; and a first portion support portion that supports the first portion in the specimen chamber. The first portion of the specimen holder has a specimen holding portion capable of holding a specimen. The second portion of the specimen holder supports the first portion via a resilient member.

In this specimen positioning device, the first portion having the specimen support portion can be placed in position independently of the second portion. Accordingly, an object or member that should be placed in position can be reduced in weight as compared with the case where the whole specimen holder is placed in position. Consequently, the effects of external disturbing vibrations can be reduced.

(2) In one feature of this specimen positioning device associated with the present invention, there may be further provided a first portion drive mechanism for moving the first portion of the specimen holder via the first portion support portion.

(3) In a further feature of this specimen positioning device associated with the present invention, the first portion drive mechanism may have: a driving portion for rotationally driving a shaft portion; and a motion converter for converting a rotary motion of the shaft portion into a linear motion and transmitting the motion to the first portion support portion.

(4) In an additional feature of this specimen positioning device associated with the present invention, the shaft portion may be disposed in an opening that is in operative communication with the specimen chamber. A magnetic fluid seal may be mounted between the shaft portion and an inner surface of the opening.

In this specimen positioning device, the magnetic fluid seal provides sealing between the shaft portion and the inner surface of the opening without using an O-ring. In consequence, outward drift which would be normally caused by an O-ring can be prevented.

(5) In a still other feature of this specimen positioning device associated with the present invention, there may be further provided: a base support portion by which the base is rotatably supported; a base drive mechanism for rotating the specimen holder via the base; and a magnetic fluid seal mounted between the base support portion and the base.

In this specimen positioning device, the magnetic fluid seal provides sealing between the base support portion and the base without using an O-ring. In consequence, outward drift which would be normally caused by an O-ring can be prevented.

(6) In a yet other feature of this specimen positioning device associated with the present invention, there may be further provided an O-ring which is mounted in the second portion of the specimen holder and which seals between this second portion and an inner surface of the hole.

In this specimen positioning device, if the first portion moves, the O-ring does not slide. Consequently, outward drift which would be normally caused by an O-ring can be prevented.

(7) In a still other feature of this specimen positioning device associated with the present invention, the specimen holder may have a third portion connected to the second portion of the specimen holder, and the third portion may have a width greater than the diameter of the hole.

In this specimen positioning device, the third portion can be held against the base by a force created by the pressure difference between the pressure inside the specimen chamber and atmospheric pressure. Therefore, the force exerted on the specimen holder by the pressure difference between the pressure inside the specimen chamber and atmospheric pressure can be borne by the base. Accordingly, movement of the specimen holder due to variations in atmospheric pressure can be suppressed. Thus, drift of the specimen can be suppressed.

(8) A charged particle beam system associated with the present invention includes a specimen positioning device associated with the present invention.

This charged particle beam system can reduce the effects of external disturbing vibrations because the system includes the specimen positioning device associated with the invention.

(9) A specimen holder associated with the present invention is for use with a charged particle beam system and has: a first portion including a specimen holding portion capable of holding a specimen; and a second portion that supports the first portion via a resilient member.

In this specimen holder, the first portion including the specimen holding portion can be placed in position independently of the second portion. Accordingly, an object or member that should be placed in position can be reduced in weight as compared with the case where the whole specimen holder is placed in position. Consequently, the effects of external disturbing vibrations can be reduced.

BRIEF DESCRIPTION OF THE DRAWINGS

FIG. 4 is a schematic cross portion of a universal coupling of the specimen positioning device shown in FIG. 1.

FIG. 5 is a diagram illustrating outward drift.

DESCRIPTION OF THE INVENTION

The preferred embodiments of the present invention are hereinafter described in detail with reference to the drawings. It is to be understood that the embodiments described below do not unduly restrict the contents of the present invention delineated by the claims and that not all the configurations described below are essential constituent components of the invention.

1. First Embodiment 1.1. Configuration of Specimen Positioning Device

Figure 1:
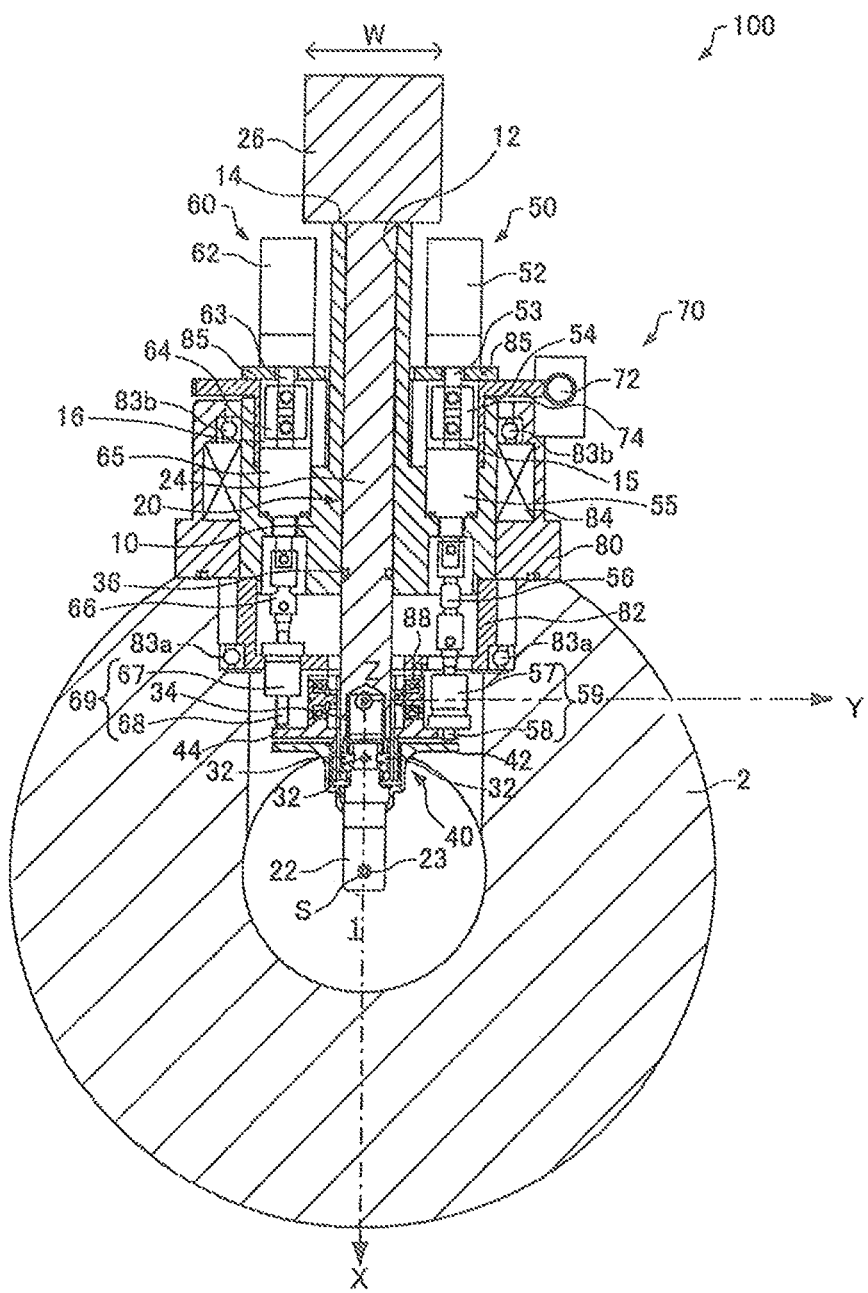
FIG. 1 is a schematic cross portion of a specimen positioning device associated with a first embodiment of the present invention.
Figure 2:
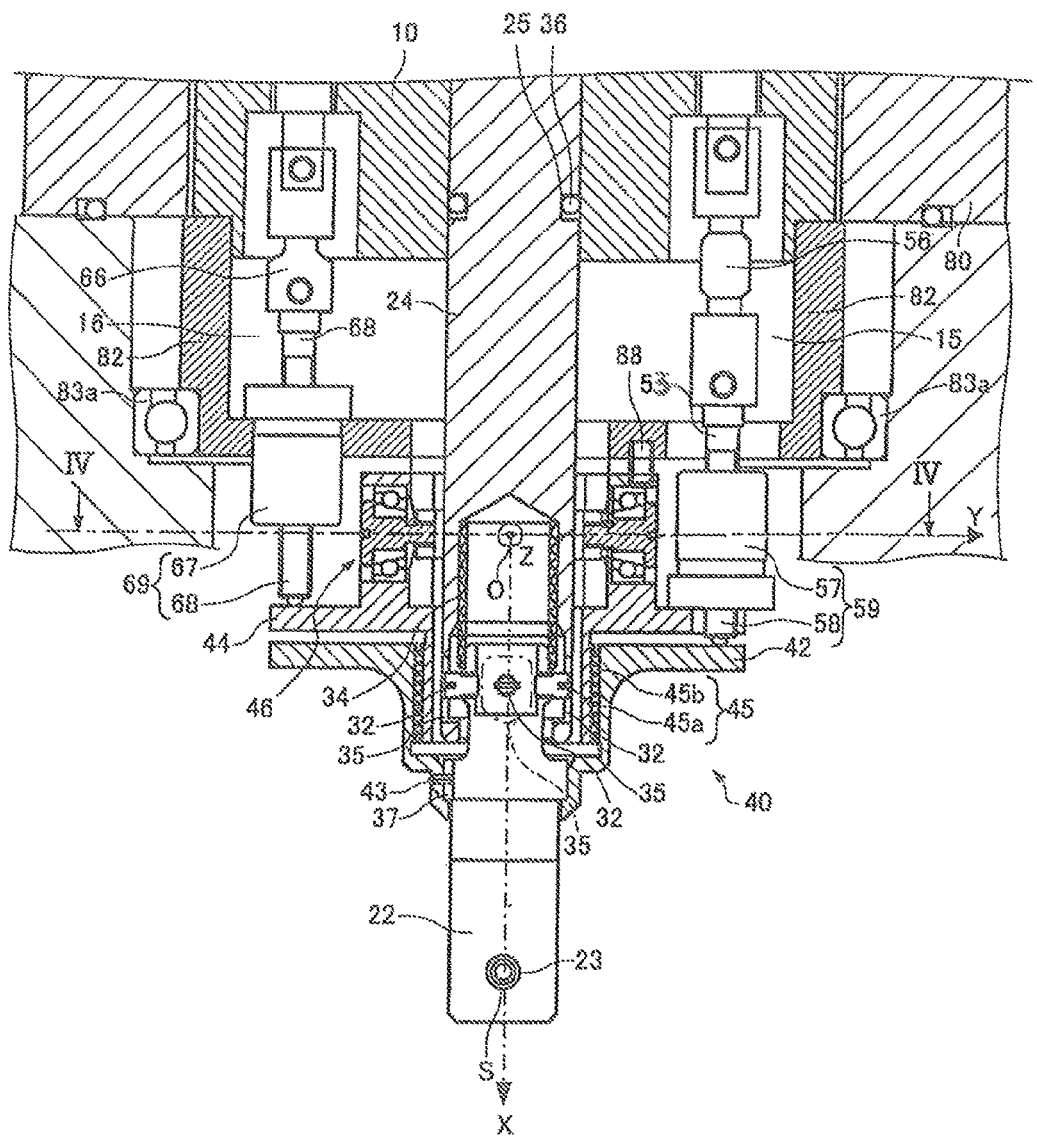
FIG. 2 is an enlarged view of a part of FIG. 1.

The configuration of a specimen positioning device associated with a first embodiment of the present invention and used in or with a charged particle beam system is first described with reference to some drawings. The specimen positioning device is generally indicated by reference numeral 100 in FIG. 1 that is a schematic cross portion of the specimen positioning device. FIG. 2 is an enlarged view of the vicinities of the front end of a specimen holder 20. In FIGS. 1 and 2, X-, Y-, and Z-axes are shown to cross each other perpendicularly at an origin O.

FIGS. 1 and 2 show the state in which the specimen positioning device 100 is in use i.e., the specimen holder 20 is mounted to a base 10.

The specimen positioning device 100 contains a specimen holder associated with the present invention. It is now assumed that the contained specimen holder is the specimen holder 20.

As shown in FIG. 1, the specimen positioning device 100 contains the base 10, specimen holder 20, and a front end support portion 40. Furthermore, the specimen positioning device 100 can contain an X-axis drive mechanism 50, a Y-axis drive mechanism 60, a base drive mechanism (hereinafter may also be referred to as the rotational drive mechanism) 70, and a flange 80. In the first embodiment, the specimen positioning device 100 is used in a transmission electron microscope.

The specimen positioning device 100 can move a specimen S into a desired position in a specimen chamber 1 and hold the specimen there. In particular, the specimen positioning device 100 can support the specimen S by the specimen holder 20 and move the specimen S in the specimen chamber 1 in the X- and Y-directions by the drive mechanisms 50 and 60. Furthermore, the specimen positioning device 100 can tilt the specimen S by the rotational drive mechanism 70.

The specimen chamber 1 of the transmission electron microscope can be maintained in a depressurized state by pumping down the chamber 1 by a well-known vacuum pump (not shown).

The sample S is introduced into the specimen chamber 1 by the specimen holder 20. The specimen S in the chamber 1 is irradiated with an electron beam. The specimen chamber 1 is a space surrounded by an electron optical column 2. In the illustrated example, the electron beam travels through the column 2 parallel to the Z-axis.

The specimen holder 20 is movably mounted in a hole 12 formed in the base 10. Thus, the specimen holder 20 can be attached to and detached from the base 10. The specimen holder 20 can be mounted in the hole 12 of the base 10 by inserting the holder 20 into the hole 12. The specimen holder 20 has a first portion (hereinafter may also be referred to as the separating front end portion) 22, a second portion (hereinafter may also be referred to as the shaft portion) 24, and a third portion (hereinafter may also be referred to as the grip portion) 26.

The separating front end portion 22 has a specimen holding portion 23 capable of holding the specimen S. The specimen holding portion 23 is mounted, for example, at the front end of the separating front end portion 22. The specimen holding portion 23 may hold the specimen S, for example, by tightening screws (not shown) or hold down the specimen S using an annular spring (not shown). When the specimen holder 20 is mounted in the hole 12 of the base 10, the specimen holding portion 23 is disposed in the specimen chamber 1.

When the specimen holder 20 is mounted in the hole 12 of the base 10, the shaft portion 24 is disposed in the hole 12 of the base 10. An O-ring 36 is mounted over the shaft portion 24. In particular, a groove 25 is formed in the outer surface of the shaft portion 24. The O-ring 36 is mounted in this groove 25. A hole extending along the X-axis as shown in FIG. 2 is formed in the front end of the shaft portion 24. A part of the separating front end portion 22 is inserted in this hole.

As shown in FIG. 1, the grip portion 26 is fixedly connected to the shaft portion 24. The grip portion 26 has a width W (in the example of FIG. 1, the length taken along the Y-axis) greater than the diameter of the hole 12 in the base 10. Therefore, when the specimen holder 20 is mounted in the hole 12 of the base 10, the grip portion 26 is not inserted in the hole 12 of the base 10 but pressed against the base 10 by a force created by the pressure difference between the pressure inside the specimen chamber 1 and atmospheric pressure. That is, the grip portion 26 is held against the base 10 by the force created by the pressure difference between the pressure inside the specimen chamber 1 and atmospheric pressure. In the illustrated example, the grip portion 26 is pressed against an end surface 14 of the base 10.

The separating front end portion 22 and the shaft portion 24 are connected together via a resilient member 34 to permit the front end portion 22 and shaft portion 24 to be moved independently. In the illustrated example, the resilient member 34 is a spring. No restrictions are placed on the structure of the resilient member 34 as long as the front end portion 22 and shaft portion 24 can be moved independently. For instance, the resilient member 34 is made of rubber. One end of the resilient member 34 is connected to the shaft portion 24, while the other end is connected to the separating front end portion 22. The resilient member 34 biases the front end portion 22 away from the shaft portion 24 (in the illustrated example, the −X-direction). That is, the resilient member 34 is a compression spring. In the illustrated example, the front end portion 22 is pressed against a slider 42 of the front end support portion 40 by the resilient member 34. Therefore, the front end portion 22 can be moved independently of the shaft portion 24 by moving the front end support portion 40. The force generated by the resilient member 34 is set to be smaller than the force of atmospheric pressure applied to the area sealed by the O-ring 36. That is, the force generated by the resilient member 34 is set to be smaller than the load applied to the specimen holder 20 by the pressure difference between the pressure inside the specimen chamber 1 and atmospheric pressure.

The O-ring 36 is in contact with the inner surface of the hole 12 in the base 10 which defines the hole 12 to provide hermetic sealing between the base 10 and the specimen holder 20. As the shaft portion 24 moves, the O-ring 36 slides in the hole 12 of the base 10. The O-ring 36 is made of a viscoelastic material such as rubber.

Figure 3:
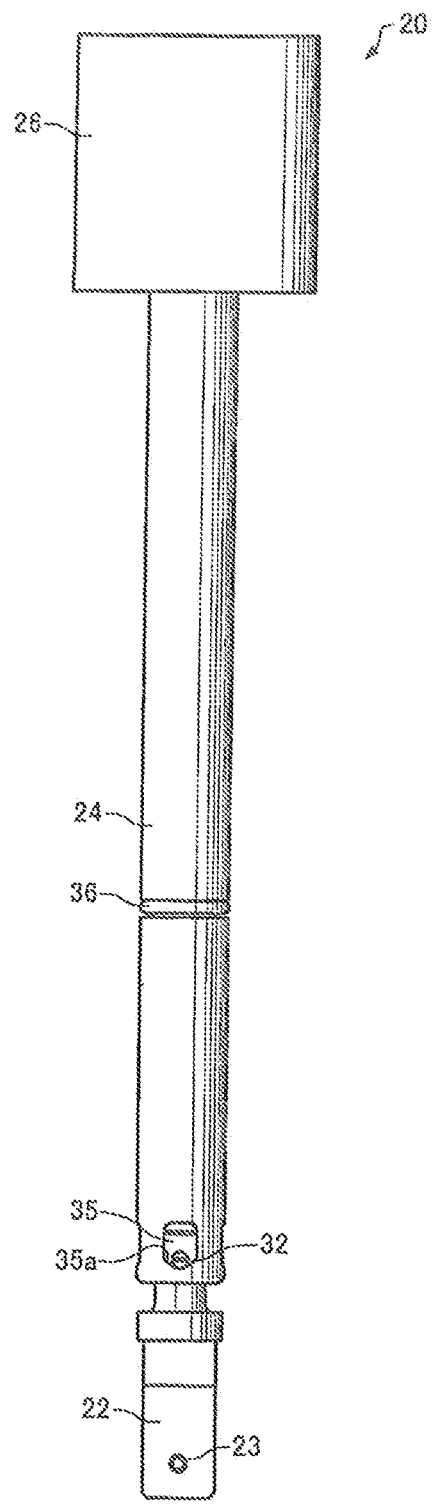
FIG. 3 is a schematic view of a specimen holder of the specimen positioning device shown in FIG. 1.

FIG. 3 schematically shows the specimen holder 20, and in which the specimen holder 20 has been removed from the base 10.

In the specimen holder 20, the shaft portion 24 and the grip portion 26 are fixed. The separating front end portion 22 and the shaft portion 24 are held by pins 32, the resilient member 34, and grooves 35 when the specimen holder 20 has been removed from the base 10. Accordingly, the front end portion 22, shaft portion 24, and grip portion 26 are not separate from each other but are integral with each other when the specimen holder 20 has been removed from the base 10.

More specifically, the pins 32 fixed to the separating front end portion 22 are pressed against the inner surfaces 35a of the V-shaped grooves 35 formed in the shaft portion 24 by the resilient member 34, thus holding the front end portion 22. This prevents the front end portion 22 from coming off the shaft portion 24 when the specimen holder 20 is removed from the base 10. The number of the pins 32 held to the front end portion 22 is four, for example. The shaft portion 24 is provided with the four grooves 35 in a corresponding manner to the four pins 32.

As shown in FIG. 1, when the specimen holder 20 is inserted in the hole 12 of the base 10, the grip portion 26 is pressed against the end surface 14 of the base 10 by the difference between the pressure inside the specimen chamber 1 hermetically sealed by the O-ring 36 and atmospheric pressure. Consequently, the shaft portion 24 and grip portion 26 are held. At this time, the separating front end portion 22 is pressed and held against the slider 42 of the front end support portion 40 by the resilient member 34. Since the resilient member 34 is compressed, the pins 32 separate from the inner surfaces 35a of the grooves 35. As a result, the separating front end portion 22 separates from the shaft portion 24. That is, the front end portion 22 can be moved independently of the shaft portion 24. The front end portion 22 is provided with grooves 37 that are wider than the diameter of positioning pins 43 mounted on the slider 42. The positioning pins 43 and grooves 37 cooperate to inhibit rotation of the front end portion 22 relative to the slider 42. In the illustrated example, the positioning pins 43 and grooves 37 constrain the degree of freedom of rotation of the front end portion 22 about the X-axis.

The base 10 has the hole 12 in communication with the specimen chamber 1. In the illustrated example, the hole 12 extends through the base 10 in the X-direction. For example, the hole 12 is cylindrical in shape. The central axis (not shown) of the hole 12 is parallel to the X-axis. The specimen holder 20 is inserted in the hole 12. Under this condition, motions of the shaft portion 24 of the specimen holder 20 in the Y- and Z-directions are restricted. A pin (not shown) is mounted on the shaft portion 24 and located closer to the grip portion 26 than the O-ring 36. A groove wider than the thickness of the pin is machined in the inner surface of the hole 12 of the base 10 and extends up to the end surface 14 parallel to the X-axis. This restrains rotation of the shaft portion 24 about the X-axis.

In the specimen chamber 1, the front end support portion 40 supports the separating front end portion 22. The support portion 40 is configured including the slider 42 and a rotor 44 as shown in FIG. 2.

The slider 42 is linearly movably held to the rotor 44 via a linear guide 45. Motions of the slider 42 other than linear motion along the linear guide 45 relative to the rotor 44 are inhibited by the linear guide 45. In the illustrated example, motions of the slider 42 other than linear motion along the X-axis relative to the rotor 44 are inhibited by the linear guide 45.

The linear guide 45 is configured including guide grooves 45a and plural balls 45b captively and rollably held in the guide grooves 45a. In the illustrated example, the guide grooves 45a extend along the X-axis. The balls 45b are disposed between the slider 42 and rotor 44. Since the balls 45b roll, the slider 42 can move linearly while experiencing a small resistance. The linear guide 45 constrains motions of the slider 42 other than the linear motion. In the illustrated example, the linear guide 45 constrains degrees of freedom of the slider 42 other than linear motion along the X-axis.

The rotor 44 is securely mounted to a stator 82 via a universal coupling 46. The rotor 44 can rotate within an angular range of several degrees about the origin O that is the center of rotation of the rotor 44. FIG. 4 is a schematic cross-sectional view of the universal coupling 46, taken on line IV-IV of FIG. 2. The universal coupling 46 is configured including a ring 47, bearings 48a, 48b, and screws 49.

Each of the rotor 44 and stator 82 is secured to the ring 47 with the screws 49 via a pair of bearings 48a or 48b. Since the bearings 48a and 48b are preloaded, the rotor 44 can rotate without rattling. In the illustrated example, the ring 47 is captively held in the rotor 44 as viewed in the Y-direction. Also, the ring 47 is captively held in the stator 82 as viewed in the Z-direction.

In the universal coupling 46, the ring 47 and rotor 44 can rotate about the Z-axis relative to the stator 82. Furthermore, the rotor 44 can rotate relative to the ring 47 about the Y-axis. Accordingly, the rotor 44 is free to rotate about the origin O. The ring 47 is hollow and the shaft portion 24 extends through the ring 47.

No restrictions are imposed on the structure of the universal coupling 46 as long as the rotor 44 can be rotatably supported by the stator 82 via the universal coupling.

The stator 82 is fixedly mounted to the base 10. The stator 82 and base 10 are integrally supported by bearings 83a and 83b so as to be rotatable about the X-axis. In the illustrated example, the bearings 83a are mounted between the stator 82 and the electron optical column 2. An outer ring for the bearings 83a is securely mounted to the electron optical column 2. The bearings 83b are mounted between the base 10 and the flange 80. An outer ring for the bearings 83b is fixedly secured to the flange 80. When the stator 82 rotates about the X-axis, the specimen holder 20 and the specimen S rotate about the X-axis.

The flange 80 supports the base 10. That is, the flange 80 functions as a base support portion. A magnetic fluid seal 84 provides sealing between the flange 80 and the base 10. Consequently, if the base 10 turns, the specimen chamber 1 can be maintained in a depressurized state.

The X-axis drive mechanism 50 is configured including a motor 52, a motor shaft 53, a coupling 54, a magnetic fluid seal 55, another coupling 56, and a motion converter 59 for converting a rotary motion into a linear motion.

The motor 52 rotationally drives the motor shaft 53. In this embodiment, the motor 52 is shown as one example of a driving portion for rotationally driving the motor shaft 53. The driving portion is not restricted to a motor as long as the motor shaft can be rotationally driven. The motor 52 is securely mounted to a plate 85, which in turn is held to a worm wheel 74.

The motor shaft 53 is connected to the motion converter 59 via the coupling 54, magnetic fluid seal 55, and coupling 56. The motor shaft 53 is disposed in an opening 15 formed in the base 10. The opening 15 is partitioned into a space in communication with the outside and another space in communication with the specimen chamber 1 by the magnetic fluid seal 55.

The magnetic fluid seal 55 is mounted between the inner surface of the opening 15 formed in the base 10 and a motor shaft 63 and seals between the inner surface of the opening 15 and the motor shaft 63. The inner surface of the opening 15 is a surface of the base 10 that defines the opening 15. The magnetic fluid seal 55 permits rotary motion of the motor shaft 53 to be introduced into the space in communication with the specimen chamber 1 while maintaining the specimen chamber 1 in a depressurized state.

The coupling 56 can expand and contract. Also, the coupling 56 can rotate through a quite small angle. The coupling 56 can absorb linear motion of a ball screw 58, as well as rotation of the motion converter 59 caused by rotation of the rotor 44. Consequently, if a ball screw 58 rotates and moves axially (i.e., along the X-axis), the rotating force can be transmitted. Furthermore, if the rotor 44 and ball nut 57 are rotated about the origin O by operation of the Y-axis drive mechanism 60 and a Z-axis drive mechanism (not shown), the rotating force can be transmitted.

A ball coupling for transmitting rotation via balls held in an outer hub groove and in an inner hub groove, a helical coupling having a cylindrical material provided with a helical slit, a bellows coupling using a bellows, or the like can be used as each of the couplings 54 and 56.

The motion converter 59 is configured including the ball nut 57 and the ball screw 58.

The ball nut 57 is secured to the rotor 44, and is in threaded engagement with the ball screw 58.

The ball screw 58 has a spherical front end in contact with the slider 42. A tension spring (not shown) is mounted between the slider 42 and the rotor 44 such that the contact surface is preloaded. Preloading is provided between the ball screw 58 and the ball nut 57 to prevent the posture of the shaft of the ball screw 58 from varying if the ball screw 58 rotates.

When the motor 52 rotates, the motor shaft 53 rotates, moving the ball screw 58 in its axial direction (along the X-axis). Consequently, the slider 42 in contact with the front end of the ball screw 58 is moved linearly along the linear guide 45. That is, the ball nut 57 and ball screw 58 convert the rotary motion of the motor shaft 53 into a linear motion and transmits it to the slider 42.

The X-axis drive mechanism 50 can move the separating front end portion 22 (and the specimen S) linearly along the linear guide 45. In the illustrated example, the X-axis drive mechanism 50 moves the front end portion 22 parallel to the X-axis. When the rotor 44 has rotated through a given angle θ from the illustrated position, the sense of the linear guide 45 also varies. Therefore, the X-axis drive mechanism 50 can translate the front end portion 22 to an axis that is tilted by the given angle θ relative to the X-axis.

The Y-axis drive mechanism 60 includes a motor 62, a motor shaft 63, a coupling 64, a magnetic fluid seal 65, another coupling 66, and a motion converter 69 for converting a rotary motion into a linear motion.

The motor 62 rotationally drives the motor shaft 63. The motor 62 is securely mounted to the plate 85. In this embodiment, the motor 62 is shown as a driving portion for rotationally driving the motor shaft 63. The driving portion is not restricted to a motor as long as the driving portion can rotationally drive the motor shaft.

The motor shaft 63 is connected to the motion converter 69 via the coupling 64, magnetic fluid seal 65, and coupling 66. The motor shaft 63 is disposed in an opening 16 formed in the base 10. The opening 16 is partitioned into a space in communication with the outside and a space in communication with the specimen chamber 1 by the magnetic fluid seal 65.

The magnetic fluid seal 65 is mounted between the inner surface of the opening 16 formed in the base 10 and the motor shaft 63. The magnetic fluid seal 65 seals between the inner surface of the opening 16 and the motor shaft 63. The inner surface of the opening 16 is a surface of the base 10 that defines the opening 16. Rotary motion of motor shaft 63 can be introduced into the space in communication with the specimen chamber 1 while the specimen chamber 1 is kept in a depressurized state by the magnetic fluid seal 65.

The coupling 66 can expand and contract. The coupling 66 can absorb linear motion of the motor shaft 63. Consequently, if a ball screw 68 rotates and moves in its axial direction (along the X-axis), the rotating force can be transmitted.

A ball coupling, helical coupling, bellows coupling, or the like can be used as each of the couplings 64 and 66.

The motion converter 69 is configured including the ball nut 67 and the ball screw 68.

The ball nut 67 is securely fixed to the stator 82 and in threaded engagement with the ball screw 68.

The ball screw 68 has a spherical front end in contact with the rotor 44. A spring 88 is mounted to preload the contact surface. Preloading is provided between the ball screw 68 and the ball nut 67 to prevent the posture of the shaft of the ball screw 68 from varying if the ball screw 68 rotates.

When the motor 62 rotates, the motor shaft 63 rotates, moving the ball screw 68 in its axial direction (i.e., along the X-axis). Consequently, the rotor 44 in contact with the front end of the ball screw 68 is rotated about the Z-axis. That is, the ball nut 67 and ball screw 68 convert the rotary motion of the motor shaft 63 into a linear motion and transmits it to the rotor 44. As a result, the separating front end portion 22 rotates about the Z-axis.

The Y-axis drive mechanism 60 can rotate the separating front end portion 22 about the Z-axis. A motion caused by rotation of the front end portion 22 can be regarded as a motion in the Y-direction if the movement is quite small. Accordingly, the Y-axis drive mechanism 60 can move the specimen S nearly along the Y-axis.

The specimen positioning device 100 can further include a Z-axis drive mechanism (not shown) which is similar in configuration with the Y-axis drive mechanism 60. This Z-drive mechanism has a ball screw that is in contact with the rotor 44 at a position which is angularly spaced by 90 degrees about the X-axis from the position at which the ball screw 68 of the Y-axis drive mechanism 60 is in contact with the rotor 44. Accordingly, the posture of the rotor 44 is determined by three points, i.e., the contact point between the rotor 44 and the ball screw 68 of the Y-axis drive mechanism 60, the contact point between the rotor 44 and the ball screw of the Z-drive mechanism, and the center of rotation (origin).

The rotational drive mechanism 70 is configured including a worm gear 72, the worm wheel 74, and a motor (not shown). The worm wheel 74 is securely mounted to the base 10. The motor is fixedly secured to the flange 80. The motor rotationally drives the worm gear 72. When the worm gear 72 turns, the worm wheel 74 rotates, rotating the base 10 about the X-axis. Consequently, the stator 82 secured to the base 10 rotates integrally with the base 10, thus rotating the specimen holder 20 about the X-axis.

1.2. Operation of Specimen Positioning Device

The operation of the specimen positioning device 100 according to the first embodiment and for use with a charged particle beam system is next described by referring to FIGS. 1-3.

The manner in which the specimen S is placed in position in the X-direction is described. In the specimen positioning device 100, the specimen S is placed in position in the X-direction by the X-axis drive mechanism 50. In particular, the motor 52 rotates the motor shaft 53, thus rotating the ball screw 58. Since the ball nut 57 is held to the rotor 44, rotation of the ball screw 58 in engagement with it moves the ball screw 58 in the X-direction. The slider 42 moves along the linear guide 45. Consequently, the separating front end portion 22 moves along the linear guide 45. In the illustrated example, the front end portion moves in the X-direction. The specimen S can be placed in position in the X-direction.

In the specimen positioning device 100, if the specimen S is moved in the X-direction by the X-axis drive mechanism 50, the specimen chamber 1 can be maintained in a depressurized state by the magnetic fluid seal 55 mounted between the inner surface of the opening 15 and the motor shaft 53. In this way, in the specimen positioning device 100, it is possible to seal between the inner surface of the opening 15 and the motor shaft 53 by the magnetic fluid seal 55 without using an O-ring. Hence, outward drift due to an O-ring can be prevented.

Outward drift is now described by referring to FIG. 5, which illustrates outward drift and does not directly correspond to the structure of the present embodiment shown in FIG. 1. In FIG. 5, an X-motor M2 is shown to move straightly rather than rotate for the sake of convenience. A specimen holder is disposed so as to extend through atmosphere and through a vacuum. A vacuum seal is provided by an O-ring mounted on the outer surface of the specimen holder. When the specimen holder moves straightly, the O-ring slides. When the X-motor M2 is driven in a direction indicated by the arrow A (hereinafter referred to as the direction A) (e.g., in the +X-direction), the specimen holder, M4, is moved linearly in the direction A while supported by a bearing M8 mounted on a specimen holder support portion M6. At this time, both a force P, which is created by the pressure difference between the pressure inside the specimen chamber and atmospheric pressure, and the frictional resistance force F of an O-ring mounted on the specimen holder M4 act on the specimen holder M4 in a direction indicated by the arrow B (hereinafter referred to as the direction B) (e.g., in the −X-direction) opposite to the direction A. The rigidity (springiness) M10 of an X-feeding mechanism exists between the X motor M2 and the bearing M8. Accordingly, the position of the specimen holder M4 is determined by the amount of feed applied by the X motor M2 and also by the balance among the force P, the frictional resistance force F of the O-ring, and the rigidity M1 of the X-feeding mechanism. If the frictional resistance force F of the O-ring does not exist, the force P and the force created by the flexure of the rigidity M10 of the X-feeding mechanism balance each other out. Therefore, the amount of feed applied by the X motor M2 agrees with the amount of motion of the specimen holder M4. On the other hand, if the frictional resistance force F of the O-ring exists, the frictional resistance force is exerted in the direction opposite to the direction of feed. Therefore, the amount of motion of the specimen holder M4 is smaller than the amount of feed applied by the X motor M2.

It is known that stress relaxation occurs in a viscoelastic material (such as rubber) of the O-ring. When the specimen holder M4 moves, the O-ring is deformed. This induces a stress in the O-ring. This stress decreases gradually with the elapse of time due to stress relaxation. Accordingly, flexure produced in the rigidity M10 of the X-feeding mechanism by the frictional resistance force F of the O-ring decreases with time. That is, the specimen holder M4 is moved in the direction A by the X motor M2 and continues to move in the same direction. This is observed as a post-motion drift. Furthermore, stress accumulated in the O-ring is also relieved as the contact surface of the O-ring continues to slip slowly. This relief similarly produces post-motion drift.

As described previously, in the specimen positioning device 100, sealing can be provided between the inner surface of the opening 15 and the motor shaft 53 by the magnetic fluid seal 55 without using an O-ring. What is placed in position is the separating front end portion 22. Since neither the shaft portion 24 nor the O-ring 36 moves, post-motion drifts attributed to an O-ring can be prevented.

What is placed in position by the X-axis drive mechanism 50 is the separating front end portion 22. Therefore, the member placed in position can be reduced in weight as compared with the case where the whole specimen holder is placed in position. For example, in the case of a drive mechanism for moving a specimen in the X-direction by rotary motion of a lever mechanism (not shown) as shown in FIG. 1 of JP-A-2010-157491, the member constituting the lever may be relatively long and have low bending rigidity. In the X-axis drive mechanism 50, any elements constituting a lever do not exist. Thus, higher rigidity can be provided.

The manner in which the specimen S is placed in position in the Y-direction is next described. In the specimen positioning device 100, the specimen S is placed in position in the Y-direction by the Y-axis drive mechanism 60. In particular, the ball screw 68 is rotated by rotating the motor shaft 63 by means of the motor 62. At this time, the ball nut 67 in threaded engagement is held to the stator 82 and so the ball screw 68 moves straightly in the X-direction. The rotor 44 in contact with the screw rotates about the Z-axis. Consequently, the separating front end portion 22 can be regarded as if it moved in the Y-direction within a quite small region. Thus, the specimen S can be placed in position in the Y-direction.

In the specimen positioning device 100, if the specimen S is moved by the Y-axis drive mechanism 60 as if it went in the Y-direction, the specimen chamber 1 can be maintained in a depressurized state by the magnetic fluid seal 65 mounted between the inner surface of the opening 16 and the motor shaft 63. Since sealing can be provided between the inner surface of the opening 16 and the motor shaft 63 in the specimen positioning device 100 by the magnetic fluid seal 65 without using an O-ring in this way, post-motion drifts due to an O-ring can be prevented.

What are placed in position by the Y-axis drive mechanism 60 are the separating front end portion 22 and the front end support portion 40. Accordingly, the weight of members placed in position can be reduced as compared with the case where a specimen holder having an inseparable front end is placed in position. Furthermore, the length of the ball screw 68, taken from the ball nut 67 to the point at which the ball screw 68 is in contact with the rotor 44, can be shortened. Furthermore, the distance from this contact point to the specimen S (specimen holding portion 23) taken in the Y-direction can be reduced. Hence, the rigidity of the mechanism for moving the separating front end portion 22 including the rotor 44 and the ball screw 68 can be enhanced. The effects of external disturbing vibrations can be reduced. In addition, thermal drift of the specimen caused by thermal expansion due to temperature variations can be suppressed by reducing these distances.

The specimen S is driven in the Z-direction by the Z-axis drive mechanism that is similar in configuration with the Y-axis drive mechanism 60 and so a description thereof is omitted.

The manner in which the specimen S is placed in position around the X-axis is next described. In the specimen positioning device 100, the specimen S is placed in position around the X-axis by the rotational drive mechanism 70. In particular, when the worm gear 72 is rotated by a motor (not shown), the direction of rotation is converted by the worm wheel 74, so that the base 10 rotates around the X-axis. Consequently, the specimen holder 20 rotates. The specimen S can be placed in position around the X-axis.

In the specimen positioning device 100, if the specimen S is rotated by the rotational drive mechanism 70, the specimen chamber 1 can be maintained in a depressurized state by the magnetic fluid seal 84 mounted between the base 10 and the flange 80. In this way, it is possible to seal between the base 10 and the flange 80 by the magnetic fluid seal 84 without using an O-ring. As a consequence, post-motion drifts due to an O-ring can be prevented.

The specimen positioning device 100 and the specimen holder 20 have the following features.

The specimen positioning device 100 has: the base 10 provided with the hole 12 in operative communication with the specimen chamber 1; the separating front end portion 22 having the specimen holding portion 23 capable of holding the specimen S; the specimen holder 20 which includes the shaft portion 24 supporting the separating front end portion 22 via the resilient member 34 and which is movably mounted in the hole 12; and the front end support portion 40 supporting the separating front end portion 22 in the specimen chamber 1. Thus, the front end portion 22 can be placed in position independently of the shaft portion 24. Therefore, the member (separating front end portion 22) to be placed in position can be made lighter in weight than, for example, where the whole specimen holder is placed in position. Consequently, the specimen positioning device 100 can be made more immune to external disturbing vibrations.

Figure 6:
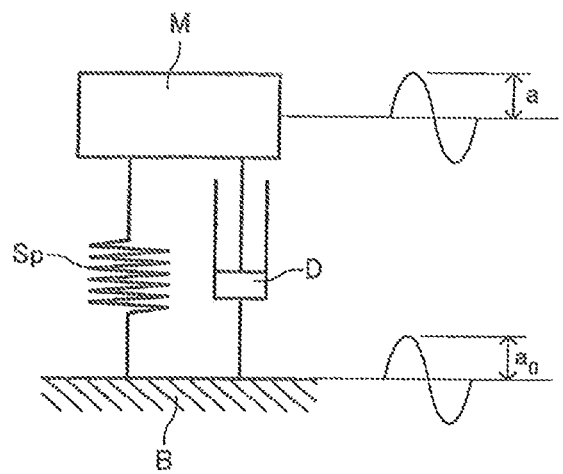
FIG. 6 is a diagram illustrating a vibration model of a system having one degree of freedom.

The relationship between weight reduction and external disturbing vibrations is now described. FIG. 6 shows a vibration model of a system having one degree of freedom. In FIG. 6, it is assumed that a mass M is connected to a base B via a spring Sp and a damper D and has a displacement of a. When the base B is forced to vibrate at a frequency f (in Hz) with a displacement of $a_0$, a relative displacement $|a_0-a|$ between the base B and the mass M is given by $$\left|\frac{a_0 - a}{a_0}\right| = \frac{\lambda^2}{\sqrt{(1-\lambda^2)^2 + (2\xi\lambda)^2}} \quad (1)$$

where $\lambda$ is the ratio of the frequency f to the natural frequency $f_n$ of the system and $\xi$ is the damping ratio of the system having one degree of freedom.

In a region where the ratio $\lambda$ is sufficiently smaller than unity, the relative displacement is in proportion to $\lambda^2$. In a general accurate measurement instrument, transmission of high frequencies can be suppressed by vibration isolators. Therefore, frequency components on the order of Hz are problematic. These frequencies on the order of Hz are sufficiently lower than the natural frequency of the apparatus and so the requirement that the ratio $\lambda$ is sufficiently lower than unity is satisfied. Where the frequency f of forced vibrations is constant, the relative displacement is inversely proportional to the square of the natural frequency $f_n$ of the system. That is, the relative displacement is given by $$\left|\frac{a_0 - a}{a_0}\right| \approx \lambda^2 = \left(\frac{f}{f_n}\right)^2 \quad (2)$$

Therefore, in order to reduce the effects of external disturbing vibrations by reducing the relative displacement, it is necessary to increase the natural frequency $f_n$ of the system. For this purpose, it is important to increase the spring constant of the spring Sp or to reduce the mass M. In the specimen positioning device 100, the member that is placed in position can be reduced in weight and, therefore, the natural frequency of the system can be raised as described previously. Hence, the effects of external disturbing vibrations, i.e., the amount of relative displacement, can be reduced.

The specimen positioning device 100 contains the X-axis drive mechanism 50, Y-axis drive mechanism 60, and Z-axis drive mechanism (not shown) for moving the separating front end portion 22 via the front end support portion 40 and so the separating front end portion 22 can be moved in the X-, Y-, and Z-directions.

In the specimen positioning device 100, the X-axis drive mechanism 50 contains the motor 52 for rotationally driving the motor shaft 53 and the motion converter 59 for converting the rotary motion of the motor shaft 53 into a linear motion and transmitting it to the front end support portion 40 (slider 42). The motor shaft 53 is disposed in the opening 15 in communication with the specimen chamber 1. The magnetic fluid seal 55 is mounted between the motor shaft 53 and the inner surface of the opening 15. Consequently, in the specimen positioning device 100, sealing can be provided between the motor shaft 53 and the inner surface of the opening 15 by the magnetic fluid seal 55 without using an O-ring. As a result, post-motion drifts due to an O-ring can be prevented.

In the specimen positioning device 100, the Y-axis drive mechanism 60 contains the motor 62 for rotationally driving the motor shaft 63 and the motor converter 69 for converting the rotary motion of the motor shaft 63 into a linear motion and transmitting it to the front end support portion 40 (rotor 44). The motor shaft 63 is disposed in the opening 16 in communication with the specimen chamber 1. The magnetic fluid seal 65 is mounted between the motor shaft 63 and the inner surface of the opening 16. Consequently, in the specimen positioning device 100, sealing can be provided between the motor shaft 63 and the inner surface of the opening 16 by the magnetic fluid seal 65 without using an O-ring. Hence, post-motion drifts due to an O-ring can be prevented. The Z-axis drive mechanism (not shown) is configured similarly.

In the specimen positioning device 100, the rotational drive mechanism 70 includes the bearings 83, 83b by which the base 10 is rotatably supported, the flange 80, and the magnetic fluid seal 84 mounted between the flange 80 and the base 10. The rotational drive mechanism 70 rotates the specimen holder 20 via the base 10. Consequently, in the specimen positioning device 100, sealing can be provided between the flange 80 and the base 10 by the magnetic fluid seal 84 without using an O-ring. Thus, post-motion drifts due to an O-ring can be prevented.

Since the specimen positioning device 100 is configured including the O-ring 36 which is mounted in the shaft portion 24 and which in contact with the inner surface of the hole 12 in the base 10, hermetic sealing can be provided between the base 10 and the specimen holder 20. If the separating front end portion 22 moves and rotates, the O-ring 36 does not slide. Therefore, post-motion drifts due to an O-ring can be prevented.

In the specimen positioning device 100, the specimen holder 20 has the grip portion 26 connected to the shaft portion 24. The grip portion 26 has a width W greater than the diameter of the hole 12. Consequently, the grip portion 26 can be held to the base 10 by a force created by the pressure difference between the pressure inside the specimen chamber 1 and atmospheric pressure. Accordingly, if atmospheric pressure varies, the specimen holder 20 can be suppressed from moving and thus drift of the specimen S due to atmospheric pressure variations can be suppressed.

The specimen holder 20 is configured including the separating front end portion 22 having the specimen holding portion 23 capable of holding the specimen S and the shaft portion 24 supporting the front end portion 22 via the resilient member 34 and so the front end portion 22 can be placed in position independently of the shaft portion 24. Accordingly, the member to be placed in position can be reduced in weight as compared with the case where the whole specimen holder is placed in position. This can reduce the effects of external disturbing vibrations.

The specimen holder 20 is so designed that when it is withdrawn, the pins 32 and the grooves 35 hold the separating front end portion 22 and the shaft portion 24 together to prevent them from separating from each other. Therefore, the specimen holder 20 can be easily inserted and withdrawn without such undesirable separation.

In the specimen positioning device 100, the specimen holder 20 has the shaft portion 24 and so a member constituting a Y-axis rotational drive mechanism can be mounted in the shaft portion 24 as described later in connection with a modification (described later). Furthermore, electrical wiring can be laid in the shaft portion 24 and the specimen S in the specimen chamber 1 can be heated. Additionally, optical fiber can be laid in the shaft portion 24 and the specimen S in the specimen chamber 1 can be illuminated with light. A flexible tube can be inserted into the shaft portion 24, and a fluid can be supplied into the separating front end portion. The specimen surrounded by the fluid and reactions of the specimen with the fluid can be observed.

1.2. Modification of Specimen Positioning Device

Figure 7:
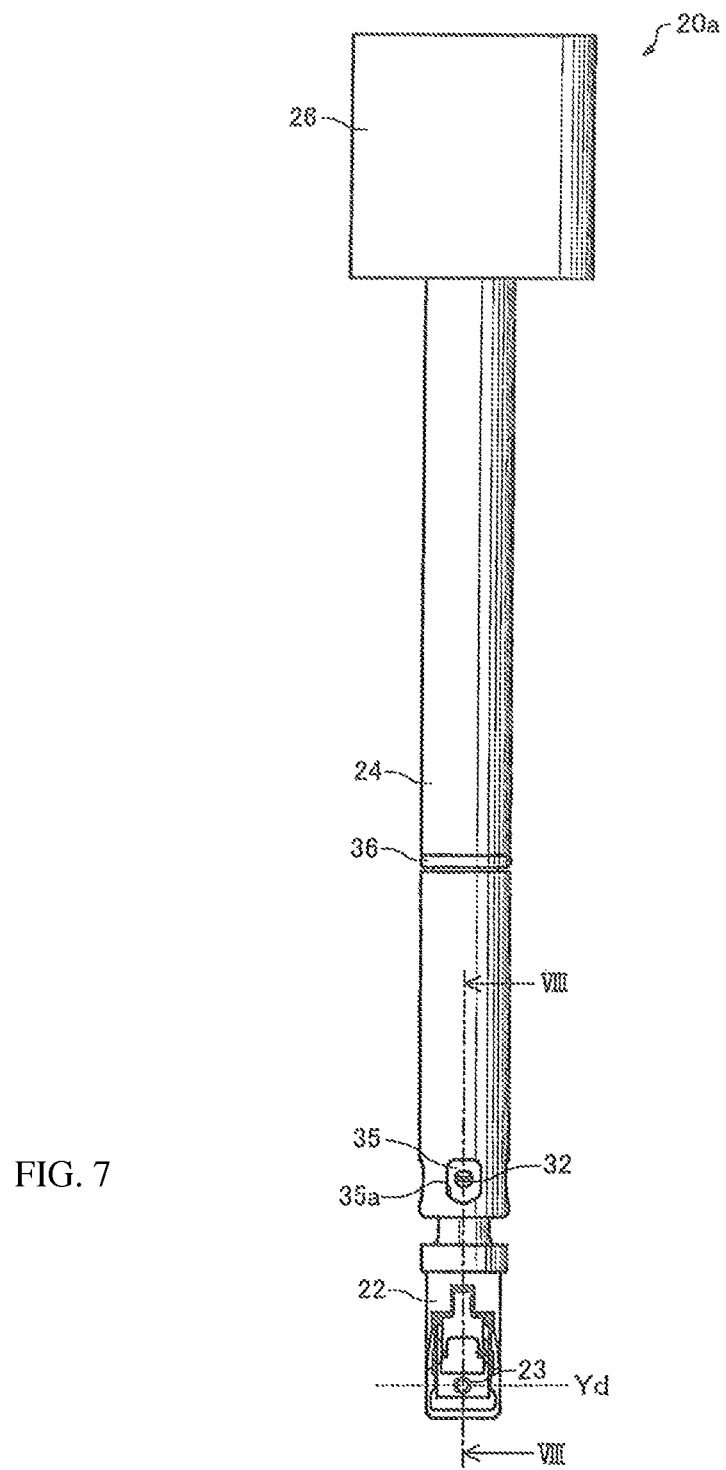
FIG. 7 is a schematic view of a specimen holder of a specimen positioning device associated with a modification of the first embodiment.
Figure 8:
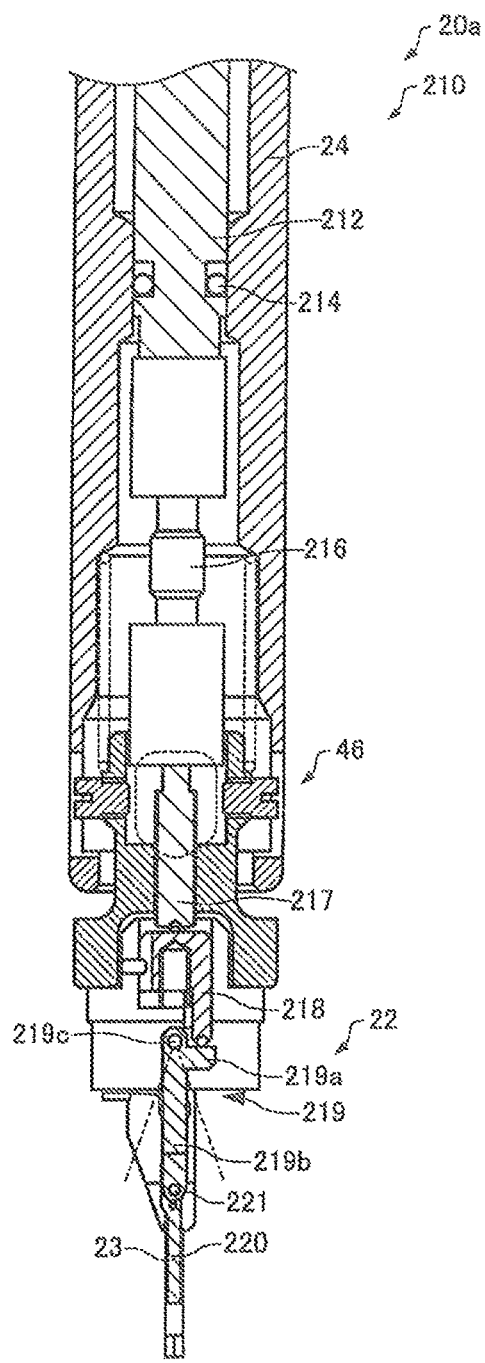
FIG. 8 is a cross-portional view taken on line VIII-VIII of FIG. 7.

A modification of the specimen positioning device 100 is next described. FIG. 7 schematically shows a specimen holder 20a of the specimen positioning device 100 associated with a modification of the first embodiment. FIG. 8 is a schematic cross portion of the specimen holder 20a of the specimen positioning device 100 associated with the modification of the first embodiment, the cross portion being taken on line VIII-VIII of FIG. 7. Those members or components of the specimen holder 20a associated with this modification which are similar in function with their respective counterparts of the above-described specimen holder 20 are indicated by the same reference numerals as in the above-cited figures and a detail description thereof is omitted.

The specimen holder 20a is configured including a Y-axis rotational drive mechanism 210 for rotating or tilting the specimen S in the specimen chamber 1 about an axis Yd that is parallel to the Y-axis and passes through the center of the specimen holding portion 23.

The Y-axis rotational drive mechanism 210 is configured including a motor shaft 212, an O-ring 214, a coupling 216, a feed screw 217, a shaft 218, a bell crank 219, and a tilting table 220.

The motor shaft 212 is mounted in the shaft portion 24 and connected to the feed screw 217 via the coupling 216.

Rotation is given to the motor shaft 212 by a motor (not shown). In the motor shaft 212, the O-ring 214 is mounted between the inner surface of the shaft portion 24 and the motor shaft 212 to seal between them.

The coupling 216 is extensible and can absorb linear motion of the feed screw 217.

The feed screw 217 is rotated by the motor shaft 212 and moves in its axial direction (in the X-direction within the specimen chamber 1). The front end of the feed screw 217 is in contact with the shaft 218.

The shaft 218 is mounted between the feed screw 217 and the bell crank 219. When the feed screw 217 moves in its axial direction, the shaft 218 moves in the same direction. The end of the shaft 218 is in contact with one arm 219a of the bell crank 219.

The bell crank 219 is mounted in the separating front end portion 22 and has arms 219a and 219b extending in different directions. The bell crank 219 is rotatably held by a pin 219c. When the shaft 218 moves in its axial direction, the bell crank 219 rotates about the pin 219c. This rotation turns the tilting table 220 that is in contact with and held by a pin 221 secured to the arm 219b.

The tilting table 220 has the specimen holding portion 23, and is rotatably held to the separating front end portion 22 by a pair of pins (not shown) for aligning the center of the table with the axis Yd. The tilting table 220 rotates about the axis Yd passing through the specimen holding portion 23. When the tilting table 220 rotates, the specimen S supported to the specimen holding portion 23 rotates or tilts about the axis Yd.

Since the specimen holder 20a is configured including the Y-axis rotational drive mechanism 210, the specimen S can be rotated or tilted about the axis Yd. If a rotation is made about the axis Yd, post-motion drifts can be prevented by adopting a magnetic fluid seal instead of the O-ring 214.

2. Second Embodiment

Figure 9:
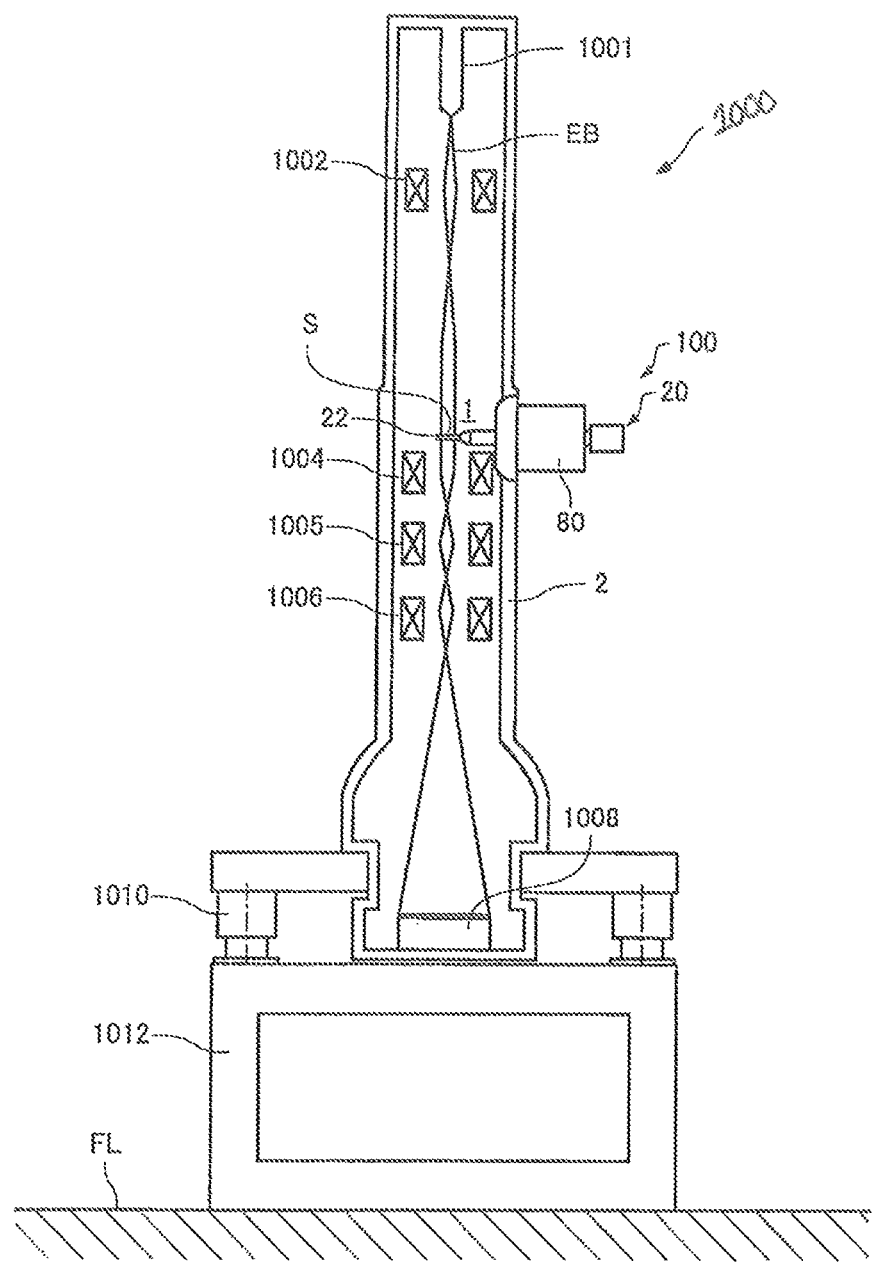
FIG. 9 is a vertical cross portion of a charged particle beam system associated with a second embodiment of the present invention.

A charged particle beam system associated with a second embodiment of the present invention is next described by referring to FIG. 9 showing the configuration of the system. The charged particle beam system, generally indicated by reference numeral 1000, is configured including a specimen positioning device associated with the present invention. It is now assumed that the charged particle beam system 1000 is configured including the specimen positioning device 100 that is shown to be simplified in FIG. 9.

As shown in FIG. 9, the charged particle beam system 1000 is configured including an electron beam source 1001, an illuminating lens 1002, the specimen positioning device 100, an objective lens 1004, an intermediate lens 1005, a projector lens 1006, an imager 1008, and an electron optical column 2. It is now assumed that the charged particle beam system 1000 is a transmission electron microscope (TEM). The charged particle beam system 1000 may also be a scanning transmission electron microscope (STEM).

The electron beam source 1001, illuminating lens 1002, objective lens 1004, and projector lens 1006 are housed in the electron optical column 2. The interior of the column 2 is pumped down by a vacuum pumping system (not shown).

The electron beam source 1001 accelerates electrons released from a cathode and releases an electron beam EB. A well-known electron gun can be used as the electron beam source 1001.

The illuminating lens 1002 is disposed behind the electron beam source 1001 and operates to direct the electron beam EB generated by the electron beam source 1001 at a specimen S. The illuminating lens 1002 is configured, for example, including condenser lenses (not shown).

The specimen S is held by the specimen holder 20 in the specimen chamber 1. The specimen S is placed in position within the specimen chamber 1 by the specimen positioning device 100.

The objective lens 1004 is disposed behind the illuminating lens 1002. The objective lens 1004 is a first stage of lens for focusing the electron beam EB transmitted through the specimen S.

The intermediate lens 1005 is disposed behind the objective lens 1004. The projector lens 1006 is disposed behind the intermediate lens 1005. The image focused by the objective lens 1004 is further magnified by the intermediate lens 1005 and projector lens 1006 and imaged on the imager 1008.

The imager 1008 has a detector for detecting the electron beam EB. For example, the detector is a CCD camera having a two-dimensional array of CCDs. The imager 1008 detects an electron microscope image and delivers information about the electron microscope image.

In the illustrated example, the charged particle beam system 1000 is mounted on a pedestal 1012 via vibration isolators 1010. The pedestal 1012 is mounted on a floor FL.

Since the charged particle beam system 1000 is configured including the specimen positioning device 100, the effects of external disturbing vibrations generated by vibrations of the floor FL can be reduced.

A case in which the specimen positioning device 100 is applied to a transmission electron microscope has been described. The specimen positioning device 100 can also be applied to charged particle beam systems other than a transmission electron microscope. Examples of charged particle beam system include electron microscope, focused ion beam system, and electron beam exposure system.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described my invention with the detail and particularity required by the Patent Laws, what is desired protected by Letters Patent is set forth in the following claims.

The invention claimed is:

1. A specimen positioning device for use in or with a charged particle beam system having a specimen chamber, said specimen positioning device (100) comprising:
    a base (10) provided with a hole in operative communication with the specimen chamber in the charged particle beam system;
    a specimen holder (20) having a first portion (22) including a specimen holding portion (23) capable of holding a specimen and a second portion (24) supporting the first portion via a resilient member (34), one end of the resilient member connected to the first portion and the other end connected to the second portion to permit the first portion and the second portion to move independently, the specimen holder being movably mounted in the hole; and
    a first portion support portion (40) that supports the first portion in the specimen chamber.

2. The specimen positioning device as set forth in claim 1, further comprising a first portion drive mechanism (50) for moving said first portion of the specimen holder via said first portion support portion (40).

3. The specimen positioning device as set forth in claim 2, wherein said first portion drive mechanism (50) has a driving portion for rotationally driving a shaft portion (53) and a motion converter (59) for converting a rotary motion of the shaft portion into a linear motion and transmitting the linear motion to said first portion support portion (40).

4. The specimen positioning device as set forth in claim 3, wherein said shaft (53) portion is disposed in an opening that is in operative communication with said specimen chamber, and wherein a magnetic fluid seal (56) is mounted between the shaft portion and an inner surface of the opening.

5. The specimen positioning device as set forth in claim 1, further comprising:
    a base support portion (10) by which said base is rotatably supported;
    a base drive mechanism (70) for rotating said specimen holder via the base; and
    a magnetic fluid seal (84) mounted between the base support portion and the base.

6. The specimen positioning device as set forth in claim 5, further comprising an O-ring (36) which is mounted in said second portion (24) of the specimen holder and which seals between this second portion and an inner surface of said hole.

7. The specimen positioning device as set forth in claim 1, wherein said specimen holder has a third portion (26) connected to said second portion of the specimen holder, and wherein the third portion has a width greater than the diameter of said hole.

8. A specimen positioning device as set forth in claim 1, wherein the first support portion (40) comprises a slider (42) for linear moving the first portion (22) generally along the axis of the second portion (24) and a rotor portion (44) for rotating the first portion (22) on an axis perpendicular to the axis of the second portion (24).

9. A specimen positioning device as set forth in claim 8, wherein the first support portion (40) further comprises separate dives drives (52) (62) for displacing the slider (42) and the rotor portion (44).

10. A specimen positioning device as set forth in claim 9, wherein magnetic fluid seals (55) (65) are positioned between the separate drives (52) (62) and the first support portion (40).

11. A charged particle beam system including a specimen positioning device as set forth in claim 1.

12. A specimen holder for use with a charged particle beam system, said specimen holder comprising:
- a first portion (22) having a specimen holding portion capable of holding a specimen; and
- a second portion (24) that supports the first portion via a resilient member (34), one end of the resilient member connected to the first portion and the other end connected to the second portion to permit the first portion and the second portion to move independently.

* * * * *

UNITED STATES PATENT AND TRADEMARK OFFICE
CERTIFICATE OF CORRECTION

PATENT NO. : 8,987,682 B2  Page 1 of 1
APPLICATION NO. : 14/101460
DATED : March 24, 2015
INVENTOR(S) : Mitsuru Hamochi It is certified that error appears in the above-identified patent and that said Letters Patent is hereby corrected as shown below:

In the Claims

Column 16, Line 66, Claim 9, delete "dives drives" and insert -- drives --

Signed and Sealed this
Twenty-eighth Day of July, 2015

Michelle K. Lee
*Director of the United States Patent and Trademark Office*